United States Patent
Melik-Martirosian

(10) Patent No.: US 9,514,823 B2
(45) Date of Patent: *Dec. 6, 2016

(54) PROGRAMMING ALGORITHM FOR IMPROVED FLASH MEMORY ENDURANCE AND RETENTION

(71) Applicant: HGST Technologies Santa Ana, Inc., Santa Ana, CA (US)

(72) Inventor: Ashot Melik-Martirosian, San Jose, CA (US)

(73) Assignee: HGST Technologies Santa Ana, Inc., Santa Ana, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/794,741

(22) Filed: Jul. 8, 2015

(65) Prior Publication Data

US 2015/0310921 A1    Oct. 29, 2015

Related U.S. Application Data

(63) Continuation of application No. 13/741,119, filed on Jan. 14, 2013, now Pat. No. 9,082,489.

(60) Provisional application No. 61/586,652, filed on Jan. 13, 2012.

(51) Int. Cl.
*G11C 16/04* (2006.01)
*G11C 16/10* (2006.01)
*G11C 11/56* (2006.01)

(52) U.S. Cl.
CPC .......... *G11C 16/10* (2013.01); *G11C 11/5628* (2013.01)

(58) Field of Classification Search
CPC ................................ G11C 16/10; G11C 16/30
USPC ..................................... 365/185.18, 185.19
See application file for complete search history.

(56) References Cited

U.S. PATENT DOCUMENTS

| 2010/0128523 A1* | 5/2010 | Yip ................ G11C 11/5628 |
| | | 365/185.03 |
| 2010/0208524 A1 | 8/2010 | Sarin et al. |
| 2011/0103150 A1 | 5/2011 | Chan et al. |
| 2011/0194353 A1* | 8/2011 | Hwang ............ G11C 11/5628 |
| | | 365/185.19 |
| 2012/0307564 A1* | 12/2012 | Moschiano ....... G11C 11/5628 |
| | | 365/185.19 |

* cited by examiner

*Primary Examiner* — Huan Hoang
(74) *Attorney, Agent, or Firm* — McDermott Will & Emery LLP

(57) ABSTRACT

A method applies a first set of consecutive pulses to flash memory cells in one or more flash memory devices to program the flash memory cells using a first pulse increment, a voltage of each consecutive pulse of the first set being incremented by the first pulse increment. On receiving an indication that the flash memory cells are partially programmed after the first set of consecutive pulses is applied, the first pulse increment is adjusted to an adjusted pulse increment based on a number of program/erase cycles associated with the flash memory cells. A second set of consecutive pulses to the flash memory cells is then applied using the adjusted pulse increment, a voltage of each consecutive pulse of the second set being incremented by the adjusted pulse increment.

21 Claims, 8 Drawing Sheets

PROGRAMMING ALGORITHM FOR IMPROVED FLASH MEMORY ENDURANCE AND RETENTION

The present application claims the benefit of priority under 35 U.S.C. §120 as a continuation of U.S. patent application Ser. No. 13/741,119 entitled "Programming Algorithm for Improved Flash Memory Endurance and Retention," filed on Jan. 14, 2013, which claims benefit of priority under 35 U.S.C. §119 to U.S. Provisional Application No. 61/586,652 entitled "Programming Algorithm for Improved Flash Memory Endurance and Retention," filed on Jan. 13, 2012, the disclosures of which are hereby incorporated by reference in their entirety for all purposes.

BACKGROUND

The subject disclosure relates to operations for programming cells of a flash memory device. Particularly, the subject disclosure pertains to an improved Incremental Stepping Pulse Program (ISPP) algorithm for improving programming speed and read-reliability in flash devices.

SUMMARY

In certain aspects, the subject technology relates to a method for programming flash memory, comprising applying a first set of consecutive pulses to flash memory cells in one or more flash memory devices to program the flash memory cells using a first pulse increment, a magnitude of each consecutive pulse of the first set being incremented by the first pulse increment, receiving an indication that the flash memory cells are partially programmed after the first set of consecutive pulses is applied, adjusting, without user interaction and in response to the indication that the flash memory cells are partially programmed, the first pulse increment to an adjusted pulse increment, and applying a second set of consecutive pulses to the flash memory cells using the adjusted pulse increment, a magnitude of each consecutive pulse of the second set being incremented by the adjusted pulse increment.

In another aspect, the subject technology relates to a data storage system including one or more flash memory devices and a memory controller externally coupled to the flash memory devices. The memory controller is configured to set parameters within the one or more flash memory devices to facilitate the performance of applying a first set of consecutive pulses to flash memory cells in the one or more flash memory devices to program the flash memory cells using a first pulse increment, a magnitude of each consecutive pulse of the first set being incremented by the first pulse increment, receiving an indication that the flash memory cells are partially programmed after the first set of consecutive pulses is applied, adjusting, without user interaction and in response to the indication that the flash memory cells are partially programmed, the first pulse increment to an adjusted pulse increment, and applying a second set of consecutive pulses to the flash memory cells using the adjusted pulse increment, a magnitude of each consecutive pulse of the second set being incremented by the adjusted pulse increment.

In yet another aspect, the subject technology relates to a computer-readable medium comprising instructions stored therein, which when executed by one or more processors cause the processors to perform operations comprising applying a first set of consecutive pulses to flash memory cells in one or more flash memory devices to program the flash memory cells using a first pulse increment, a voltage of each consecutive pulse of the first set being incremented by the first pulse increment, receiving an indication that the flash memory cells are partially programmed after the first set of consecutive pulses is applied, adjusting, without user interaction and in response to the indication that the flash memory cells are partially programed, the first pulse increment to an adjusted pulse increment based on a number of program/erase cycles associated with the flash memory cells, and applying a second set of consecutive pulses to the flash memory cells using the adjusted pulse increment, a voltage of each consecutive pulse of the second set being incremented by the adjusted pulse increment.

It is understood that other configurations of the subject technology will become readily apparent from the following detailed description, wherein various configurations of the subject technology are shown and described by way of illustration. As will be realized, the subject technology is capable of other and different configurations and its several details are capable of modification in various other respects, all without departing from the scope of the subject technology. Accordingly, the drawings and detailed description are to be regarded as illustrative in nature and not as restrictive.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, the subject technology may be practiced without these specific details. In some instances, structures and components are shown in block diagram form in order to avoid obscuring the concepts of the subject technology. Like components are labeled with identical element numbers for ease of understanding.

The subject disclosure describes a method for improving programming operations in a NAND flash memory device.

Figure 1:
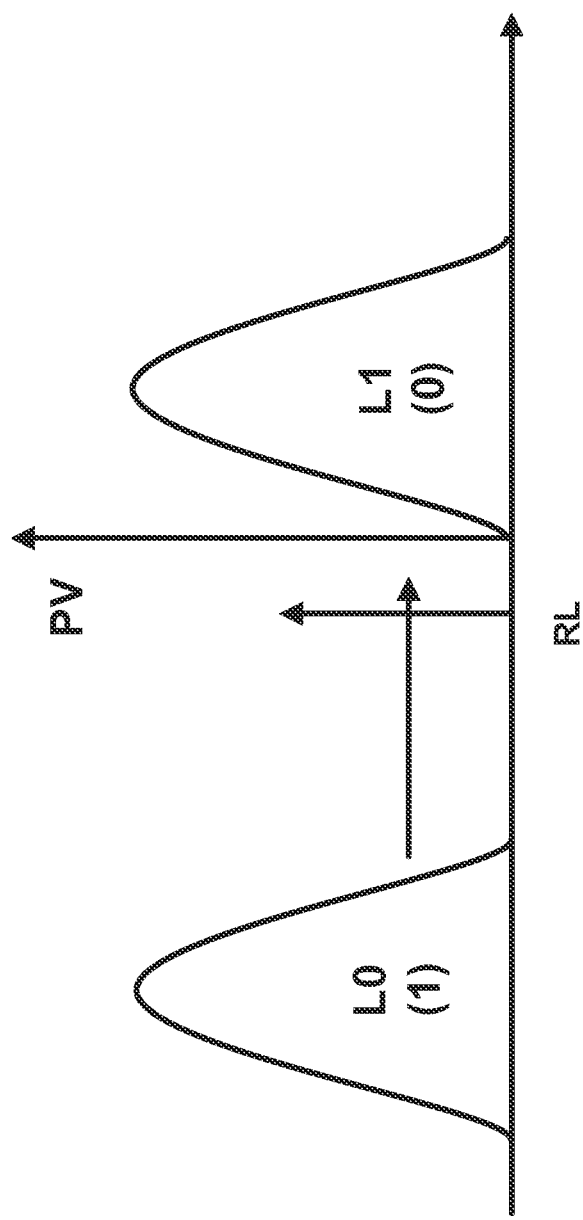
FIG. 1 illustrates an example of a voltage distribution for a programming operation performed on a single-level (SLC) device.

FIG. 1 illustrates an example of voltage distributions for a programming operation performed on a single-level cell (SLC) device. Specifically, FIG. 1 shows voltage distributions corresponding to Level 0 and Level 1 programming states, as well as a read-level (RL) and program verify level (PV).

Figure 2:
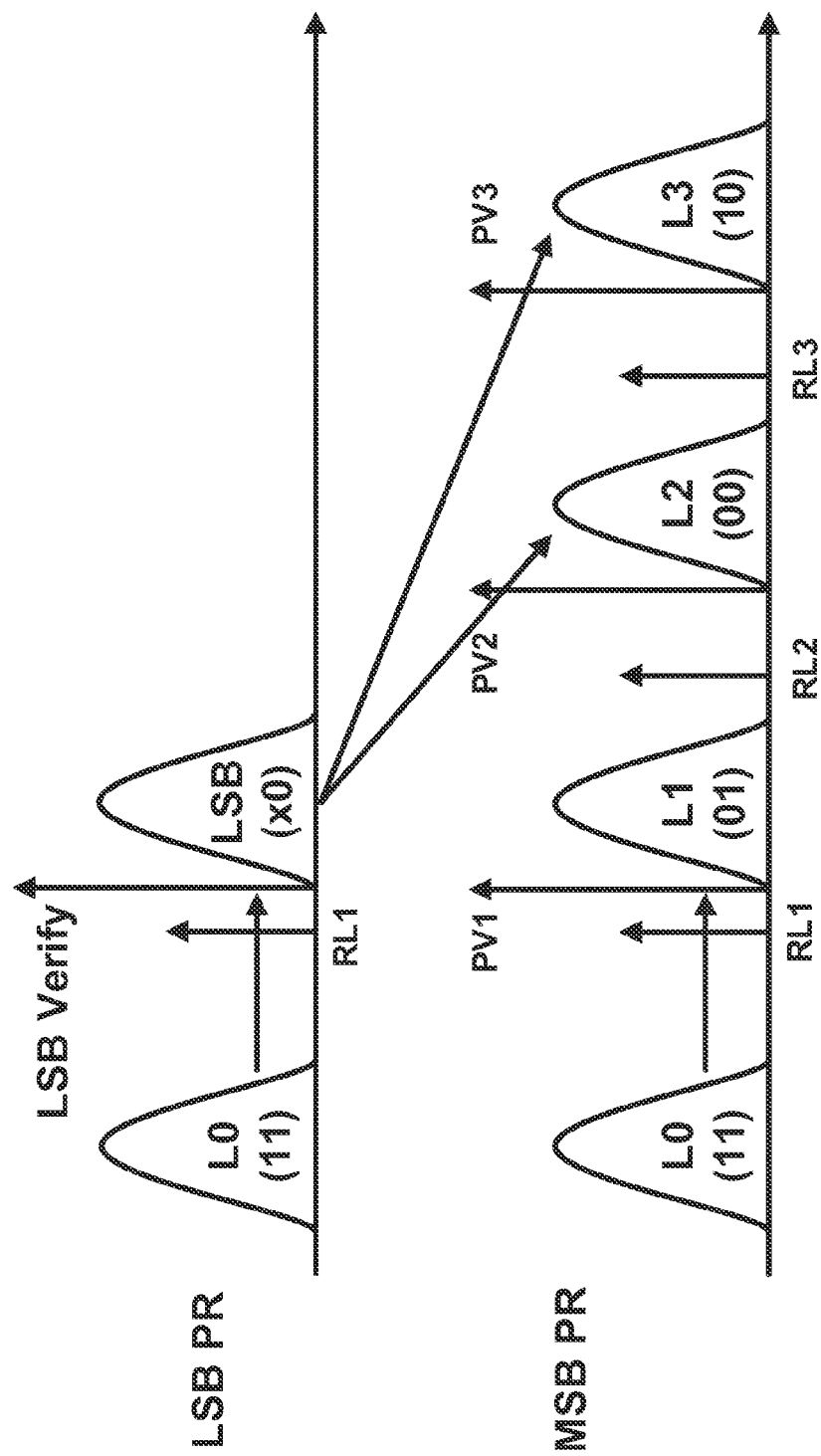
FIG. 2 illustrates an example of a voltage distribution for a programming operation performed on a multi-level cell (MLC) device.

FIG. 2 illustrates an example of voltage distributions that correspond to programming states of a multi-level cell (MLC) device e.g., a 2-bit/cell NAND device. The voltage distributions for the least-significant bit (LSB) programming are illustrated (top), together with an indicated read level (RL1) and LSB verification level (LSB Verify). FIG. 2 also illustrates voltage distributions for the most-significant hit (MSB) programming (bottom), together with indicated read levels (e.g., RL1, RL2 or RL3) and program verification levels (e.g., PV1, PV2 and PV3).

The MLC programming operation can comprise two phases, performed in sequence. First the least-significant bit (LSB) programming operation is performed. This operation creates two voltage distributions. Second, the most significant bit (MSB) programming operation is performed to create the final four programmed voltage distributions, as shown in FIG. 2.

Figure 3:
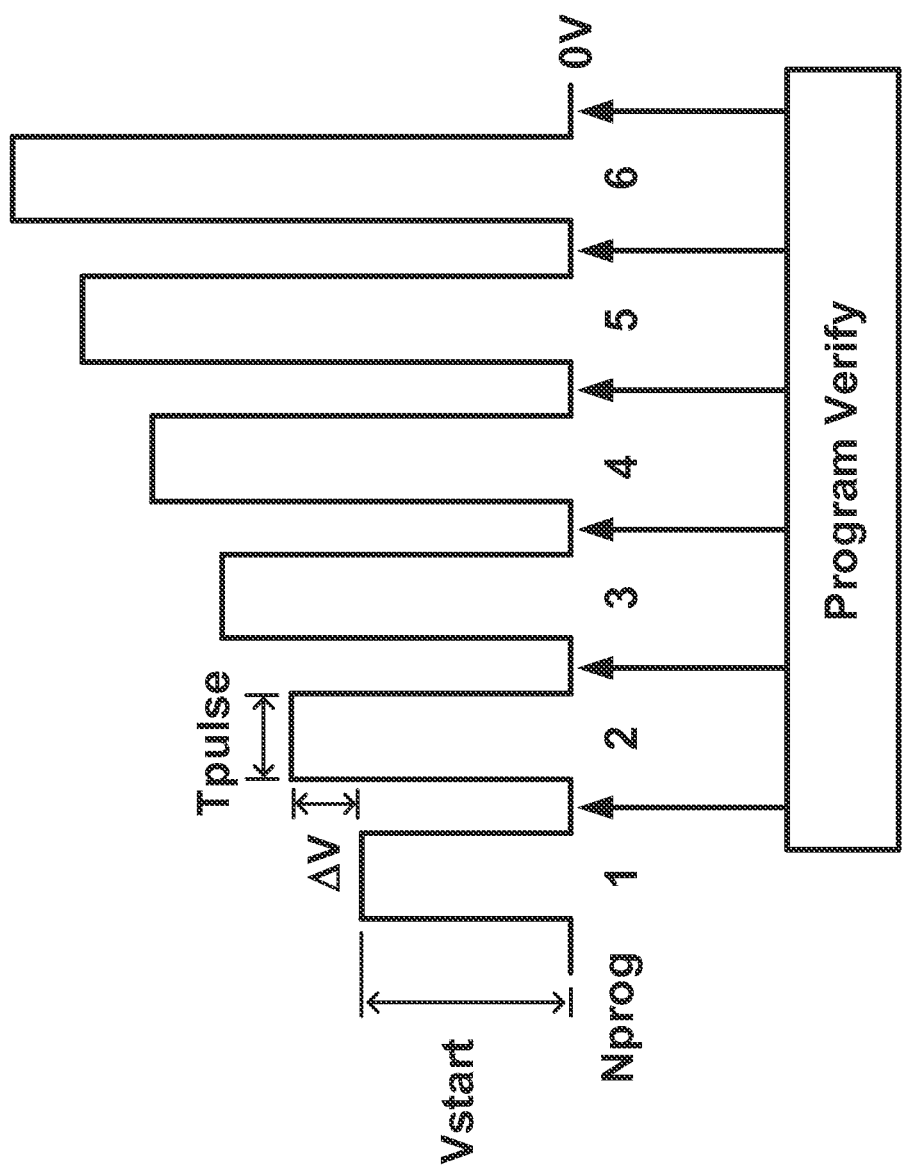
FIG. 3 conceptually illustrates an Incremental Stepping Pulse Program (ISPP).

FIG. 3 illustrates an example of an Incremental Stepping Pulse Program (ISPP) that can be used to write data to flash memory, according to some aspects of the subject disclosure. Specifically, a programming operation performed in 2-bit/cell (MLC) and 1-bit/cell (SLC) devices is accomplished by applying a series of programming pulses (of increasing positive magnitude), followed by a verification operation after every pulse, until all of the cells in the page are programmed (as shown in FIG. 3). FIG. 3 further illustrates examples of parameters that can be used in an ISPP algorithm. For example, FIG. 3 shows a starting programming voltage ($V_{START}$), a voltage amplitude increment ($\Delta V$), a programming pulse number ($N_{PROG}$) and a programming pulse width (Tpulse). In certain aspects, the starting programming voltage ($V_{START}$) will correspond with a voltage amplitude of the first pulse. The voltage amplitude increment ($\Delta V$) will correspond with a positive magnitude by which the voltage amplitude of each subsequent pulse is increased, and the programming pulse number ($N_{PROG}$) corresponds with a total number of pulses to be applied in the write operation. In certain aspects, a maximum number of allowed programming pulses is designated as '$N_{MAX}$.' In some implementations, these parameters can be stored in registers of a flash chip, and used by the flash chip to select corresponding characteristics when performing a write operation.

Figure 4:
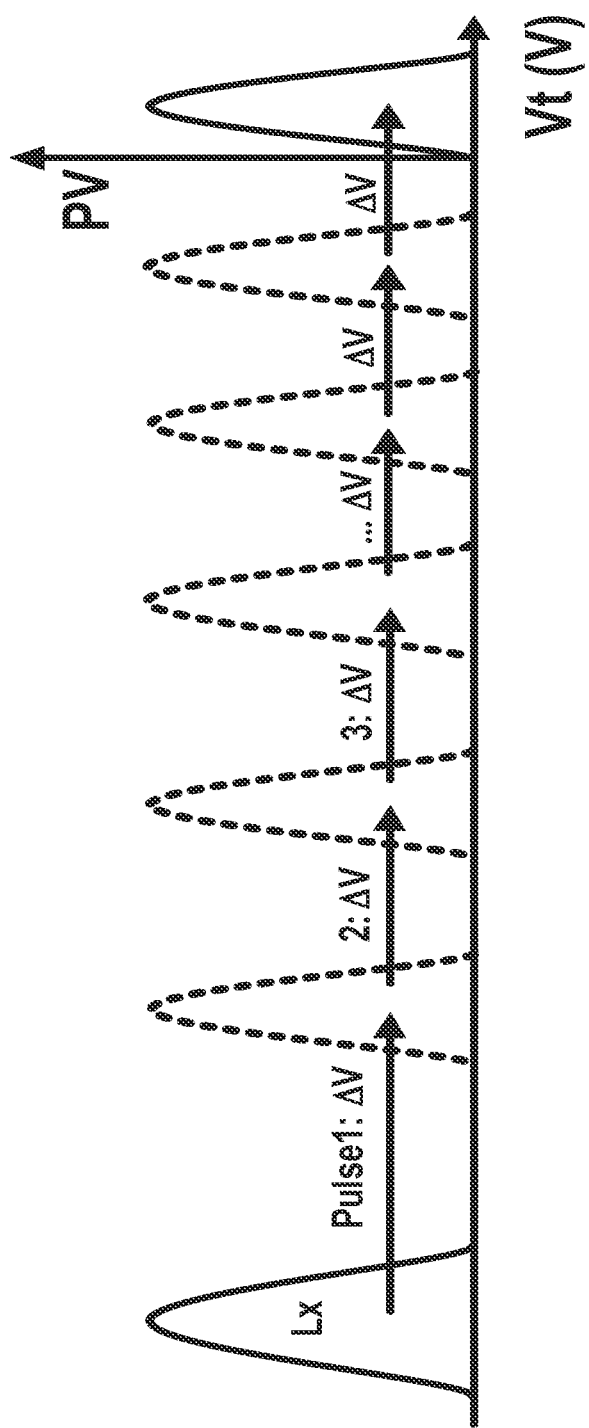
FIG. 4 graphically illustrates an example of voltage distribution shifts that can occur during an ISPP procedure.

During solid-state drive operation, once a programming command (e.g., a write operation) is issued for a given memory page, an ISPP procedure begins and programming pulses with an amplitude increasing by a constant increment ($\Delta V$) are applied. FIG. 4 graphically illustrates an example of voltage distribution shifts that can occur during an ISPP procedure. During a ISPP procedure, the programmed threshold voltage distribution gradually shifts to the right after every pulse (as shown in FIG. 4), until all of the cells are sufficiently programmed to populate their respective $V_t$-distributions, e.g., to have Vt's above the Program Verify (PV) level. At the conclusion of the ISPP procedure, the flash chip can return a 'Pass' status to indicate that the programming operation for a particular page has been successfully completed. Alternatively, the flash chip can return a "Fail" status to indicate that the programming operation failed after applying the maximum number of allowed programming pulses ($N_{MAX}$).

In some implementations, the LSB ISPP pulse voltage amplitude increment ($\Delta V$) is on the order of 700-900 mV, while that of the MSB ISPP pulse is on the order of 200-300 mV. In certain aspects, the typical pulse width (Tpulse), for an individual ISPP programming pulse, is on the order of 5-10 μs and the typical duration of a programming verification operation is on the order of 50-100 μs. In certain aspects, the time required to perform a LSB programming operation is on the order of 0.5 ms (e.g., LSB programming may require the application of 5-10 programming pulses), while in some aspects, the MLC MSB programming time may be much longer (e.g., 2.5-3.5 ms). That is, in some examples, the MSB programming operation may require the application of 15 or more programming pulses such that the MLC programming tune (calculated as the average of LSB and MSB programming times) can be 1.5-2.0 ms.

The use of a greater voltage amplitude increment ($\Delta V$), a larger voltage amplitude, can decrease the time required to perform a programming operation and, hence, improve the overall write performance of an SSD device. In some examples, MLC MSB programming can require the application of more programming pulses (of a greater amplitude) due to the much higher final threshold voltages of L2 and L3 distributions, as compared to MLC LSB or L1 distributions, or as compared to a SLC L1 distribution (see FIG. 2 and FIG. 1, respectively).

The use of programming pulses with larger voltage amplitudes and with a higher voltage amplitude increment ($\Delta V$), can cause negative effects. Specifically, larger voltage amplitudes and amplitude increments can be associated with an increase in the L1, L2 and L3 distribution widths, thus decreasing the separations/windows between programmed levels L0, L1, L2 and L3 that are necessary to perform reliable read operations. Furthermore, larger voltage amplitudes and amplitude increments are known to contribute to the degradation of the flash memory cells during programming/erase cycling.

The natural degradation of flash memory cells that occurs during programming/erase cycling typically results in faster programming speeds, which in turn increases the distribution widths as the number of programming/erase cycles increases. Additionally, during retention the read windows between levels L0, L1, L2 and L3 gradually close due to shifts (to the left) in the programmed threshold voltage distributions. The amount of this threshold voltage shift, and hence the amount of read window closing, increases with the degradation of the flash and is proportional to the number of programming/erase cycles that the flash has undergone. It should be noted that the magnitudes of the final remaining read windows after retention are proportional to the magnitude of the read windows before retention. Thus, a need for higher-voltage programming pulses and voltage amplitude increments, limits certain MLC flash reliability characteristics.

Specifically, increases in programming pulse voltages and voltage amplitude increments ($\Delta V$) can detrimentally affect endurance (e.g., the maximum number of programming/erase cycles that flash memory can undergo) and retention (e.g., the ability to maintain sufficiently large read windows, after the flash is programmed). On the other hand, using a lower starting programming voltage ($V_{START}$), and/or lower-voltage amplitude increments ($\Delta V$), can result in tighter L1, L2, and L3 programmed distributions but can slow down the programming operation, and negatively affect SSD write performance.

Because of the factors discussed above, in using current ISPP procedures, flash memory manufacturers are forced to choose between intermediate magnitude values of starting programming voltage ($V_{START}$) and the voltage amplitude increment ($\Delta V$). The need for sufficient write performance dictates that $V_{START}$ and $\Delta V$ are sufficiently high, which limits the endurance of today's flash devices. For example, typical programming/erase endurance in 32 nm MLC flash is on the order of 3 k cycles, whereas the endurance required for a 5-year operation of some enterprise-class SSDs is on the order of (40-60) k cycles.

The subject technology comprises a variable ISPP programming algorithm that improves SSD write performance, while increasing the flash programming/erase endurance and retention. Specifically, in contrast to a traditional ISPP programming algorithm (where all programming pulses are applied until all of the cells in the page are programmed), the subject technology provides a variable ISPP programming algorithm in which the programming operation is broken into multiple parts. In some aspects, the programming operation is broken into two parts, with a portion of the total programming pulses applied during a first part of the programming operation and the remainder of the programming pulses applied during a second part of the programming operation.

Figure 5:
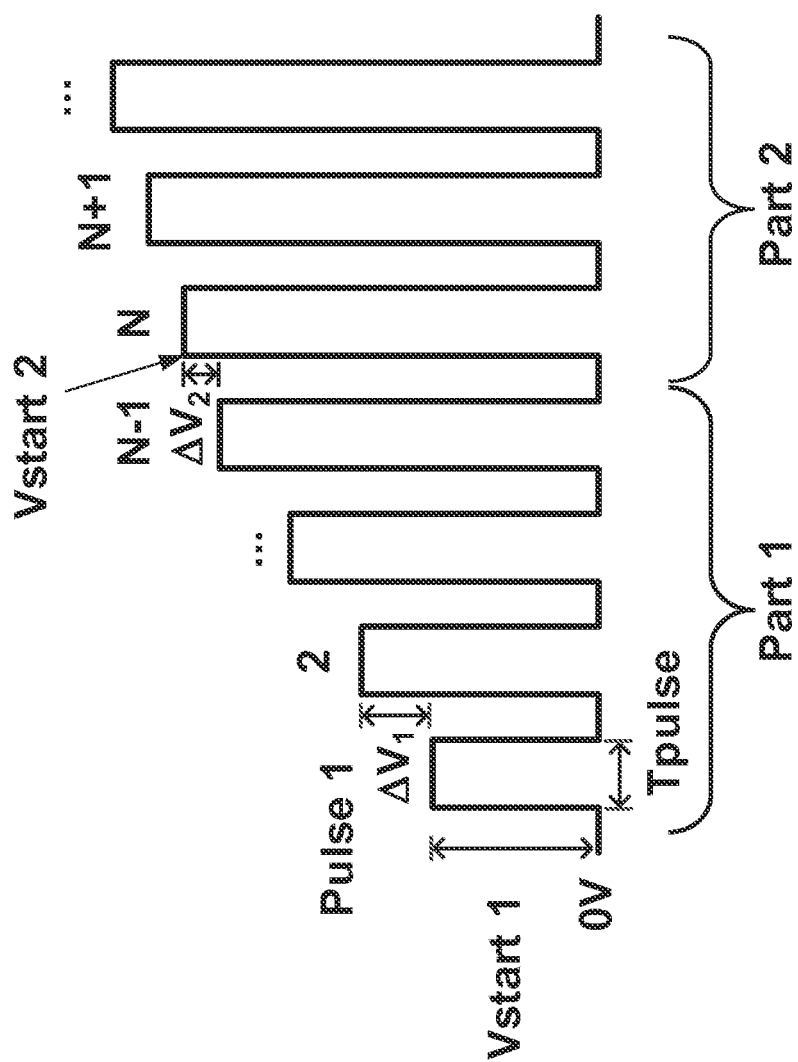
FIG. 5 graphically illustrates an example of a sequence of programming pulses applied using a variable ISPP algorithm, according to some aspects of the technology.

FIG. 5 graphically illustrates an example of a sequence of programming pulses applied using a variable ISPP algorithm, according to some aspects of the subject technology. In the example illustrated in FIG. 5, the variable ISPP programming algorithm consists of two parts e.g., Part 1 and Part 2. However, depending on implementation, ISPP algorithms of the subject technology can consist of three or more parts. Each part of the programming operation is associated with a particular configuration of write parameters, which can be selected by setting (e.g., programming) one or more registers in the flash memory. For example, write parameters can include values for $V_{START}$, $T_{PULSE}$, $\Delta V_1$ and/or $\Delta V_2$, which can be used to control characteristics of a write operation including a starting program voltage, a pulse width, a first amplitude increase voltage, and a second amplitude increase voltage, respectively.

A determination of write parameters to be used for a write operation can be accomplished in various ways. In some aspects, one or more write parameters may be determined based on experimental data, and/or based on one or more of retention and/or endurance characteristics known for a flash memory. Similarly, selection of certain write parameters can be based on indications received from flash memory, for example, in response to a 'Fail' status indicating that a write operation was unable to complete, and/or based on endurance and/or retention characteristics for a particular flash chip.

Part 1 of the programming operation illustrated in FIG. 5 begins with Pulse 1, having amplitude of $V_{START}$ 1. Each programming pulse in Part 1 (as well as Part 2) has a width (duration) defined by $T_{PULSE}$. Furthermore, each pulse in Part 1 occurring after Pulse 1 is increased in voltage amplitude by a voltage amplitude increase of $\Delta V_1$. Part 1 includes a total of N-1 total pulses, where N can be an integer value corresponding to a number of programming pulses for a part of a write operation (e.g., a first part or Part 1 of a write operation). At the conclusion of Part 1, the flash memory may return a status to indicate whether the write operation has completed, or whether further programming pulses will be required to complete the write operation. In certain aspects, a 'Failed' status may be returned, indicating that the programming operation is incomplete.

Part 2 of the write operation may be performed in response to a 'Failed' status returned by the flash memory with respect to Part 1 of the write operation. As illustrated, Part 2 of the operation begins with pulse N-1, and continues until a predetermined number of pulses have been provided. In some aspects, the maximum number of pulses for all parts of a write operation is determined by a parameter set in the flash memory to indicate a maximum number of total programming pulses, e.g., an integer value for '$N_{MAX}$' (not shown). As described in further detail below, one or more of the write parameters for Part 2 of the write operation may be different from those set for Part 1. Such changes can be made by, changing (e.g., reprogramming) values written to one or more registers in the flash memory.

As illustrated in the example of FIG. 5, Part 2 of the write operation is associated with a different voltage amplitude increase with respect to that set in Part 1, that is, Part 2 is associated with a voltage amplitude increase of $\Delta V_2$. The value of $V_{START}$ 2 in Part 2 has also been changed, for example at the beginning of Part 2 (e.g., at pulse N) the $V_{START}$ 2 value is given by:

$$V_{START}2 = V_{START}1 + (N-1)(\Delta V_1) + \Delta V_2 \quad (1)$$

Although any write parameters may be changed between different parts of the write operation (e.g., between Part 1 and Part 2), in certain aspects, a value of $\Delta V_2$ is smaller than that of $\Delta V_1$.

Figure 6:
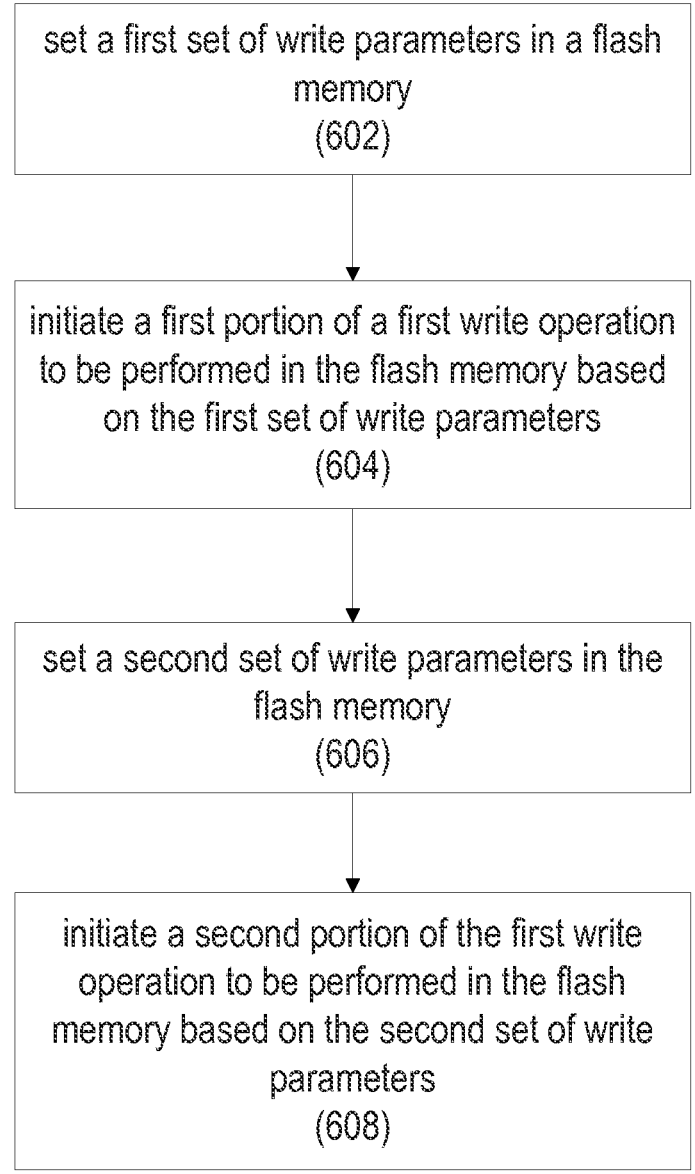
FIG. 6 illustrates an example process for adjusting write parameters to perform a write operation in flash memory, according to certain aspects of the subject technology.

FIG. 6 illustrates an example process 600 for adjusting write parameters to perform a write operation in flash memory, according to certain aspects of the subject technology. Process 600 begins with step 602 in which a first set of write parameters in a flash memory are set. As discussed above, write parameters can be used to change various properties associated with a write operation to be performed in flash memory. Write parameters can include, but are not limited to, one or more of a voltage increment value ($\Delta V$), a starting program voltage ($V_{START}$), a pulse width ($T_{PULSE}$), and/or a maximum number of allowed programming pulses ($N_{MAX}$).

By way of example, one or more write parameters in a first set of write parameters could be set in a flash memory, by sending the first set of write parameters from a controller to the flash memory, and writing the first set of write parameters to one or more registers in the flash memory.

In step 604, a first portion of a first write operation to be performed in the flash memory is initiated based on the first set of write parameters. Further to the example given with respect to FIG. 5, the first portion of the first operation may be carried out based on a first set of write parameter including a first voltage increment value ($\Delta V_1$), a first starting program voltage ($V_{START}$ 1), a first pulse width ($T_{PULSE}$ 1), and/or a maximum number of allowed programming pulses ($N_{MAX}$ 1).

At the conclusion of the first portion of the first write operation, the flash memory may return a 'Fail' status (e.g., to the controller) to signify that the first write operation is incomplete, that is, that the cells to be programmed in the first write operation are only partially programmed. In certain aspects, a second set of write parameters can be sent to the flash memory in response to the receipt of a 'Failed' status.

In step 606, a second set of write parameters is set in the flash memory. Similar to the process for setting the first set of write parameters, the second set of write parameters may be sent by a controller to the flash memory, wherein the second set of write parameters are programmed to the same one or more registers used to store the first set of write parameters. As such, the registers of the flash memory are re-programmed, such that next portion of the write operation is performed using parameters corresponding with the second set of write parameters.

Further to the example of FIG. 5, the second set of write parameter may include one or more of a second voltage increment value ($\Delta V_2$), a second starting program voltage ($V_{START}2$), a first pulse width ($T_{PULSE}2$), and/or a maximum number of allowed programming pulses ($N_{MAX}2$).

In step 608, a second portion of the first write operation to be performed in the flash memory is initiated, wherein the second portion of the first write operation is based on the second set of write parameters. In certain aspects, at least one parameter in the second set of write parameters is different from a corresponding parameter in the first set of write parameters.

By way of example, the value for $\Delta V_2$ may be smaller than that of $\Delta V_1$, such that the second voltage increment between pulses in the second portion of the first write operation is smaller than that as between pulses in the first portion of the first write operation. In some implementations, by decreasing the step size of the voltage increment (e.g., by selecting $\Delta V_2 < \Delta V_1$), can result in tighter programmed distributions (e.g., for programming levels L1, L2, and L3).

In certain implementations, upon conclusion of the second portion of the first write operation, the flash will return a status indicator to the controller. In some implementations, the flash memory will return a 'Pass' status indicator to indicate that the first programming operation has successfully completed. Alternatively, the flash memory may return a 'Fail' status indicator to indicate that the first programming operation is still incomplete. In response, a third set of write parameters may be sent to the flash memory after completion of the second part of the first write operation. By way of example, the third set of write parameters may include a third voltage increment value ($\Delta V_3$), a third starting program voltage ($V_{START}3$) and/or a third pulse width $T_{PULSE}3$). As such, the first programming operation may continue with a third portion, wherein a series of programming pulses are applied with increasing successive magnitudes of $\Delta V_3$ and where $\Delta V_3 < \Delta V_2$.

In certain aspects, after the completion of the third portion of the first programming operation, the flash memory will return a 'Pass' status, indicating that the write operation as completed successfully. Alternatively, if a 'Fail' status is received, the first programming operation may be continued in one or more additional portions.

Figure 7:
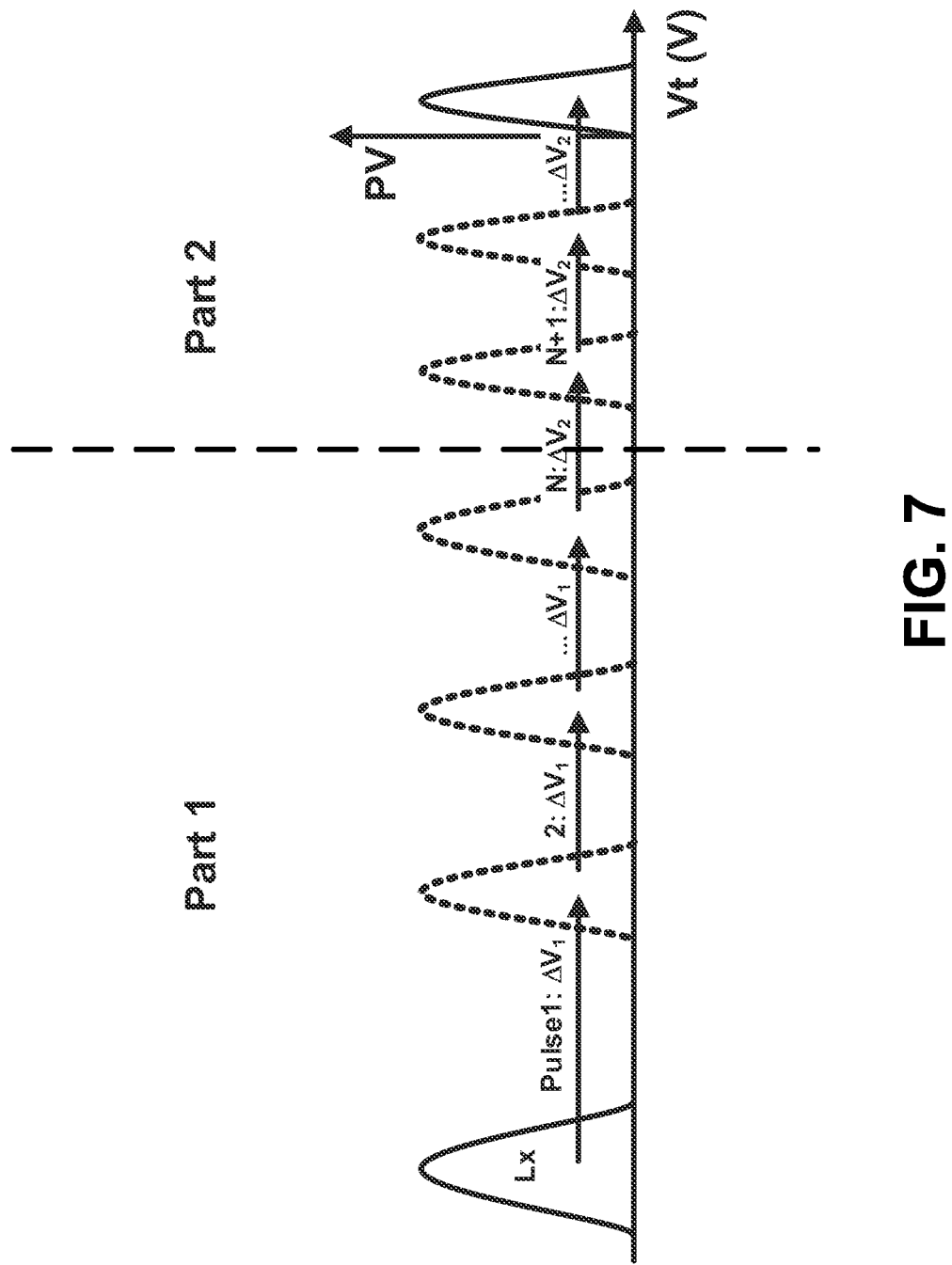
FIG. 7 illustrates an example of shifting voltage distributions that can occur when performing a programming operation using a variable ISPP algorithm, according to some aspects of the technology.

FIG. 7 further illustrates an example of shifting voltage distributions that occur when performing a programming operation using a variable ISPP algorithm. Programming is completed when the remainder of the programming pulses (starting with Pulse N), are applied during "Part 2" of the programming operation. In some examples, at the conclusion of Part 2, all of the cells in the page are fully programmed. As illustrated in FIG. 5, the voltage amplitude increment ($\Delta V$), is reduced from $\Delta V_1$ in Part 1 to $\Delta V_2$ in Part 2.

In certain implementations, at the beginning of Part 1 (when a programming command is received), the maximum allowed number of programming pulses ($N_{MAX}$) is set to (N−1) and the $N_{MAX}$ parameter is written into an appropriate register in the flash chip. Setting $N_{MAX}$ to (N−1) means that the flash chip will return a "Fail" status after applying (N−1) programming pulses, and the programming procedure will stop, unless all of the cells in the page are fully programmed. As mentioned above, in certain aspects, a typical MSB programming operation may require application of a total of 15 or more programming pulses, therefore, in certain implementations $N_{MAX}$ can be set in the range of (5-10) at the beginning of Part 1.

As shown in the examples depicted in FIGS. 4 and 5, after Part 1 is complete (and the flash chip is partially programmed), the SSD firmware modifies the initial ISPP parameters. First, the voltage amplitude increment is decreased from $\Delta V_1$ to $\Delta V_2$. Second, the value of $V_{START}$ is increased a factor of $\Delta V*(N-1)$. Third, the value of $N_{MAX}$ is increased. In some implementations, $N_{MAX}$ is increased to a range of 10-15.

Subsequently, the modified ISPP parameters are written into the appropriate flash registers and Part 2 begins and continues until all of the cells in the page have been fully programmed. By breaking the programming procedure into multiple parts (e.g., into two parts, as described above) it is possible to set the value of the voltage amplitude increment of Part 1, $\Delta V_1$ to a value higher than the default $\Delta V$ value initially set in a flash chip by the flash's manufacturer. Doing so increases the amplitude of the programming voltage pulses used in Part 1, and speeds up the programming procedure when the threshold voltage distributions are in intermediate, partially programmed states. As noted above, typical values of $\Delta V$ for MSB ISPP are on the order of 200-300 mV, therefore, in some implementations, $\Delta V_1$ can be set in the 300-500 mV range. Comparatively, in some implementations $\Delta V_2$ can be set in the 100-200 mV range.

As discussed above, decreasing the voltage amplitude increment at the beginning of Part 2 from $\Delta V_1$ to $\Delta V_2$ (i.e., to a value lower than the default $\Delta V$ value initially set in the flash chip by the flash manufacturer), can slow down the programming operation, but results in tighter final L1, L2, and L3 programmed distributions, which is highly desirable in order to extend the MLC flash endurance and retention characteristics. By sufficiently speeding up programming in Part 1 (despite the slow-down of the programming speed in Part 2), the overall programming speed in the proposed algorithm is faster than the existing ISPP algorithm. At the same time, the variable ISPP algorithm yields tighter final L1, L2, and L3 programmed distributions. Depending on implementation, the values of the variable ISPP algorithm parameters (e.g., $V_{START}$ and $N_{MAX}$ for Part 1 and $\Delta V_1$, and $\Delta V_2$) can be optimized to achieve different desired programming speed, endurance, and retention characteristics.

Figure 8:
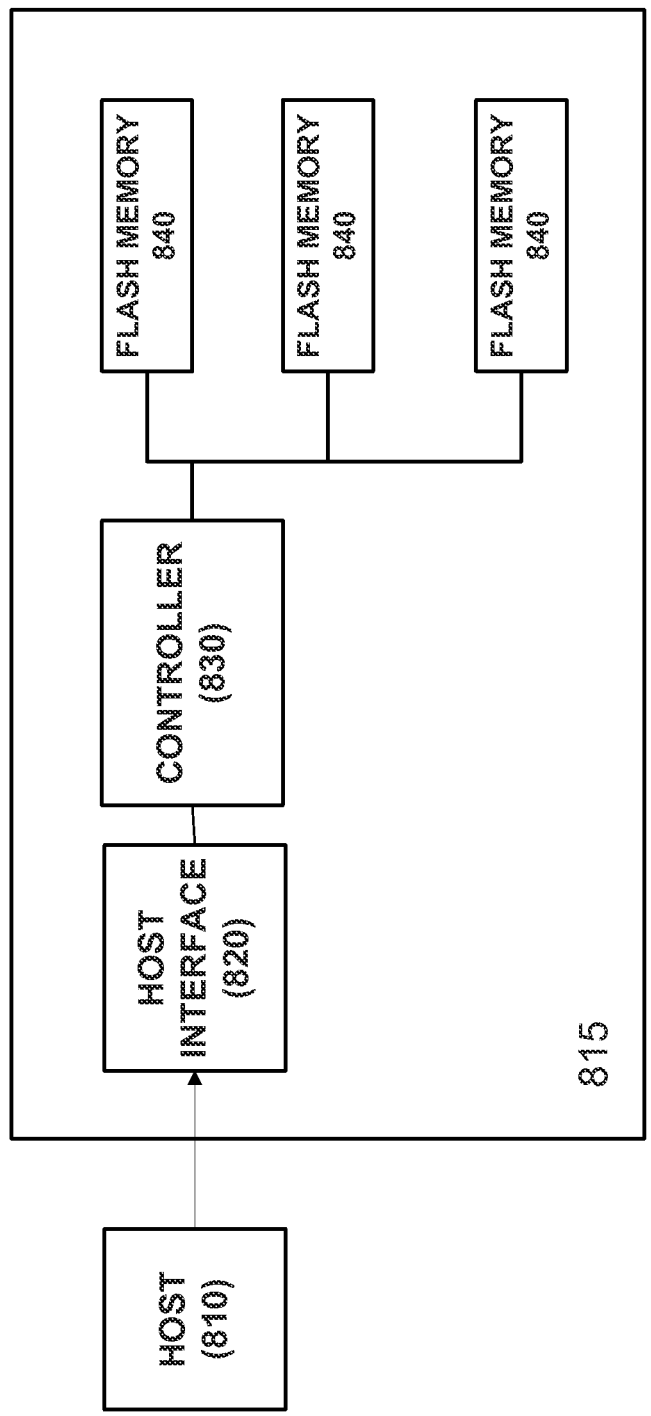
FIG. 8 illustrates an example of a flash memory device, according to some aspects of the technology.

FIG. 8 is a block diagram illustrating components of a flash storage device 815 according to one aspect of the subject technology. As depicted in FIG. 8, flash storage device 815 includes host interface 820, controller 830 and an array of flash memory 840. Furthermore, flash storage device 815 is coupled to host 810, via host interface 820. The elements of the flash memory device may be integrated into a single chip or may be implemented in two or more discrete components.

Controller 830 may be implemented with a general-purpose microprocessor, a microcontroller, a digital signal processor (DSP), an application specific integrated circuit (ASIC), a field programmable gate array (FPGA), a programmable logic device (PLD), controller, a state machine, gated logic, discrete hardware components, or a combination of the foregoing. One or more sequences of instructions may be stored as firmware on ROM within controller 830, such as instructions for carrying out process 600 described above with respect to FIG. 6.

Additionally, one or more sequences of instructions also may be software stored and read from another storage medium, such as the flash memory array, or received from host 810 via host interface 820. ROM, storage mediums, and flash memory arrays represent examples of machine or computer readable media on which instructions/code executable by controller 830 may be stored. Machine or computer readable media may generally refer to any medium or media used, to provide instructions to the controller, including both volatile media, such as dynamic memory used for storage media or for buffers within controller 830, and non-volatile media, such as electronic media, optical media, and magnetic media.

Host interface 820 may be configured to implement a standard interface, such as Serial-Attached SCSI (SAS), Fiber Channel interface, PCI Express (PCIe), SATA, USB, and the like. Host interface 820 may be configured to implement only one interface. Alternatively, host interface 820 may be configured to implement multiple interfaces, which are individually selectable using a configuration parameter selected by a user or programmed at the time of assembly. Host interface 820 may include one or more buffers for buffering transmissions between host 810 and controller 830. A host 810 may be any device configured to be coupled to flash storage device 815 and to store data in flash storage device 815. Host 810 can be a computing system such as a personal computer, a server, a workstation, a laptop computer, PDA, smart phone, and the like. Alternatively, host 810 may be an electronic device such as a digital camera, a digital audio player, a digital video recorder, and the like.

Flash memory array 840 represents non-volatile memory devices for storing data. According to one aspect of the subject technology, flash memory array 840 includes NAND flash memory. Each component of flash memory array 840 can include a single flash memory device or chip, or may include multiple flash memory devices or chips arranged in multiple channels, as depicted in FIG. 8. Flash memory 840 is not limited to any particular capacity or configuration. For example, the number of physical blocks, the number of physical pages per physical block, the number of sectors per physical page, and the size of the sectors may vary within the scope of the subject technology.

In some implementations, aspects of the subject disclosure may be implemented in a memory device. For example, aspects of the subject disclosure may be integrated with the function of controller 830 or may be implemented as separate components for use in conjunction with controller 830.

Those of skill in the art would appreciate that the various illustrative blocks, modules, elements, components, methods, and algorithms described herein may be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject technology.

It is understood that the specific order or hierarchy of steps in the processes disclosed is presented as an illustration of some exemplary approaches. Based upon design preferences and/or other considerations, it is understood that the specific order or hierarchy of steps in the processes can be rearranged. For example, in some implementations some of the steps can be performed simultaneously. Thus the accompanying method claims present elements of the various steps in a sample order, and are not meant to be limited to the specific order or hierarchy presented.

The previous description is provided to enable any person skilled in the art to practice the various aspects described herein. The previous description provides various examples of the subject technology, and the subject technology is not limited to these examples. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the invention.

The predicate words "configured to", "operable to", and "programmed to" do not imply any particular tangible or intangible modification of a subject, but, rather, are intended to be used interchangeably. For example, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

A phrase such as an "aspect" does not imply that such aspect is essential to the subject technology or that such aspect applies to all configurations of the subject technology. A disclosure relating to an aspect may apply to all configurations, or one or more configurations. An aspect may provide one or more examples. A phrase such as an aspect may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. An embodiment may provide one or more examples. A phrase such as an "embodiment" may refer to one or more embodiments and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples. A phrase such as a "configuration" may refer to one or more configurations and vice versa.

The word "exemplary" is used herein to mean "serving as an example or illustration," Any aspect or design described herein as "exemplary" is not necessarily to be construed as preferred or advantageous over other aspects or designs.

What is claimed is:

1. A method for programming flash memory, comprising:
applying a first set of consecutive pulses to flash memory cells in one or more flash memory devices to program the flash memory cells to a predetermined target voltage level using a first pulse increment, a magnitude of each consecutive pulse of the first set being incremented by the first pulse increment, a width of each consecutive pulse of the first set being set to a first pulse width;

receiving, after the first set of consecutive pulses are applied, a program failed status returned by the one or more flash memory devices, indicating that the programming of the flash memory cells to the predetermined target voltage level is incomplete;

adjusting, without user interaction and in response to the program failed status, the first pulse increment to an adjusted pulse increment; and applying a second set of consecutive pulses to the flash memory cells to program the flash memory cells to the predetermined target voltage level using the adjusted pulse increment, a magnitude of each consecutive pulse of the second set being incremented by the adjusted pulse increment, a width of each consecutive pulse of the second set being set to a second pulse width, wherein the second pulse width is different than the first pulse width.

2. The method of claim 1, wherein adjusting the first pulse increment comprises a first memory controller external to the one or more flash memory devices setting parameters internal to the one or more flash memory devices, the adjusted pulse increment being based on the parameters.

3. The method of claim 2, wherein the parameters are set based on a number of programming/erase cycles associated with the flash memory cells.

4. The method of claim 2, further comprising:
setting, by the first memory controller, a predetermined number of pulses to be applied during the first or second sets of consecutive pulses.

5. The method of claim 2, further comprising:
setting, by the first memory controller, a starting voltage of the first or second sets of consecutive pulses, wherein the first pulse increment or the adjusted pulse increment comprises an amount of voltage by which each respective pulse of the first or second sets of consecutive pulses is incremented relative to a previous pulse, starting from the starting voltage.

6. The method of claim 1, wherein the pulse increment comprises an amount of voltage.

7. The method of claim 1, further comprising:
adjusting, without user interaction and in response to the program failed status, a pulse duration applied to the first set of consecutive pulses, wherein each of one or more of the second set of consecutive pulses is applied for the adjusted pulse duration.

8. The method of claim 1, wherein adjusting the first pulse increment comprises reducing the first pulse increment such that the adjusted pulse increment is lower than the first pulse increment.

9. The method of claim 1, wherein adjusting the first pulse increment comprises increasing the first pulse increment such that the adjusted pulse increment is higher than the first pulse increment.

10. The method of claim 1, wherein the first and second sets of consecutive pulses are performed in one of a least significant bit programming operation and a most significant bit programming operation.

11. A data storage system comprising:
one or more flash memory devices;
a memory controller externally coupled to the one or more flash memory devices and configured to set parameters within the one or more flash memory devices to facilitate performance of:
applying a first set of consecutive pulses to flash memory cells in the one or more flash memory devices to program the flash memory cells to a predetermined target voltage level using a first pulse increment, a magnitude of each consecutive pulse of the first set being incremented by the first pulse increment, a width of each consecutive pulse of the first set being set to a first pulse width;

receiving, after the first set of consecutive pulses is applied, a program failed status returned by the one or more flash memory devices, indicating that the programming of the flash memory cells to the predetermined target voltage level is incomplete;

adjusting, without user interaction and in response to the program failed status, the first pulse increment to an adjusted pulse increment; and applying a second set of consecutive pulses to the flash memory cells using the adjusted pulse increment to program the flash memory cells to the predetermined target voltage level, a magnitude of each consecutive pulse of the second set being incremented by the adjusted pulse increment, a width of each consecutive pulse of the second set being set to a second pulse width, wherein the second pulse width is different than the first pulse width.

12. The data storage system of claim 11, wherein the parameters are set based on a number of programming/erase cycles associated with the flash memory cells.

13. The data storage system of claim 11, wherein the memory controller is configured to set a predetermined number of pulses to be applied during the first or second sets of consecutive pulses.

14. The data storage system of claim 11, wherein the memory controller is configured to set a starting voltage of the first or second sets of consecutive pulses, wherein the first pulse increment or the adjusted pulse increment comprises an amount of voltage by which each respective pulse of the first or second sets of consecutive pulses is incremented relative to a previous pulse, starting from the starting voltage.

15. The data storage system of claim 11, wherein the pulse increment comprises an amount of voltage.

16. The data storage system of claim 11, further comprising:
adjusting, without user interaction and in response to the program failed status, a pulse duration applied to the first set of consecutive pulses, wherein each of one or more of the second set of consecutive pulses is applied for the adjusted pulse duration.

17. The data storage system of claim 11, wherein adjusting the first pulse increment comprises reducing the first pulse increment such that the adjusted pulse increment is lower than the first pulse increment.

18. The data storage system of claim 11, wherein adjusting the first pulse increment comprises increasing the first pulse increment such that the adjusted pulse increment is higher than the first pulse increment.

19. The data storage system of claim 11, wherein the first and second sets of consecutive pulses are performed in one of a least significant bit programming operation and a most significant bit programming operation.

20. A non-transitory computer-readable medium comprising instructions stored therein, which when executed by one or more processors cause the processors to perform operations comprising:
applying a first set of consecutive pulses to flash memory cells in one or more flash memory devices to program the flash memory cells to a predetermined target voltage level using a first pulse increment, a width of each consecutive pulse of the first set being set to a first pulse width;

receiving, after the first set of consecutive pulses is applied, a program failed status returned by the one or more flash memory devices, indicating that the programming of the flash memory cells to the predetermined target voltage level is incomplete;

adjusting, without user interaction and in response to the program failed status, the first pulse width to an adjusted pulse width based on a number of program/erase cycles associated with the flash memory cells; and applying a second set of consecutive pulses to the flash memory cells to the predetermined target voltage level using the adjusted pulse width, a width of each consecutive pulse of the second set being set to the second pulse width, wherein the second pulse width is different than the first pulse width.

21. The non-transitory computer-readable medium of claim 20, wherein the first and second sets of consecutive pulses are performed in one of a least significant bit programming operation and a most significant bit programming operation.

* * * * *